United States Patent
Lee et al.

(12)

(10) Patent No.: US 11,752,516 B2
(45) Date of Patent: Sep. 12, 2023

(54) APPARATUS FOR PROCESSING SUBSTRATE

(71) Applicant: SAMSUNG ELECTRONICS CO., LTD., Suwon-si (KR)

(72) Inventors: Dongkeun Lee, Hwaseong-si (KR); Jongho Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/453,506

(22) Filed: Nov. 4, 2021

(65) Prior Publication Data

US 2022/0234069 A1 Jul. 28, 2022

(30) Foreign Application Priority Data

Jan. 27, 2021 (KR) .................. 10-2021-0011699

(51) Int. Cl.
*B05C 5/02* (2006.01)
*G03F 7/16* (2006.01)

(52) U.S. Cl.
CPC ............ *B05C 5/0225* (2013.01); *G03F 7/162* (2013.01)

(58) Field of Classification Search
None
See application file for complete search history.

(56) References Cited

U.S. PATENT DOCUMENTS

| 4,899,686 | A | * | 2/1990 | Toshima | B05C 3/109 118/54 |
|---|---|---|---|---|---|
| 5,658,615 | A | * | 8/1997 | Hasebe | G03F 7/162 438/782 |
| 5,688,322 | A | * | 11/1997 | Motoda | G03F 7/162 118/500 |
| 5,762,709 | A | | 6/1998 | Sugimoto et al. | |
| 5,942,035 | A | * | 8/1999 | Hasebe | H01L 21/67017 118/313 |
| 6,063,190 | A | * | 5/2000 | Hasebe | H01L 21/67017 118/313 |

(Continued)

FOREIGN PATENT DOCUMENTS

| JP | 2001-176767 | 6/2001 |
|---|---|---|
| KR | 10-0563911 | 3/2006 |

(Continued)

*Primary Examiner* — Jethro M. Pence
(74) *Attorney, Agent, or Firm* — F. CHAU & ASSOCIATES, LLC

(57) ABSTRACT

The inventive concept provides an apparatus for processing a substrate. The apparatus includes a mount; a processing liquid supply nozzle configured to provide a processing liquid to the substrate and a discharge container including: a base plate including a liquid outlet and an exhaust port; an inner wall standing on an inner circumference of the base plate; an outer wall standing on an outer circumference of the base plate; and a barrier standing on the base plate to separate a first space connected to the liquid outlet from a second space connected to the exhaust port. The apparatus further includes an inner cover configured to guide the flow of a processing liquid from the substrate supported by the mount to the first space of the discharge container; and a flow guide mounted in the first space of the discharge container.

20 Claims, 8 Drawing Sheets

(56) References Cited

U.S. PATENT DOCUMENTS

| | | | | |
|---|---|---|---|---|
| 6,579,370 | B2 * | 6/2003 | Kimura | G03F 7/168 |
| | | | | 118/66 |
| 7,344,600 | B2 * | 3/2008 | Inada | H01L 21/67051 |
| | | | | 118/321 |
| 7,582,163 | B2 | 9/2009 | Kim et al. | |
| 7,615,117 | B2 * | 11/2009 | Kobayashi | H01L 21/68735 |
| | | | | 118/612 |
| 7,802,536 | B2 * | 9/2010 | Yoshihara | G03F 7/162 |
| | | | | 118/612 |
| 7,891,366 | B2 * | 2/2011 | Ito | H01L 21/67075 |
| | | | | 134/201 |
| 8,166,913 | B2 * | 5/2012 | Tanaka | H01L 21/6715 |
| | | | | 118/712 |
| 8,256,370 | B2 * | 9/2012 | Kitano | H01L 21/67051 |
| | | | | 134/182 |
| 8,277,884 | B2 * | 10/2012 | Kobayashi | H01L 21/68721 |
| | | | | 134/198 |
| 8,287,954 | B2 * | 10/2012 | Yoshihara | G03F 7/162 |
| | | | | 438/782 |
| 8,375,887 | B2 | 2/2013 | Takayanagi et al. | |
| 8,496,991 | B2 | 7/2013 | Yoshihara et al. | |
| 8,574,674 | B2 * | 11/2013 | Tanaka | H01L 21/6715 |
| | | | | 118/712 |
| 8,631,756 | B2 * | 1/2014 | Noh | H01L 21/6715 |
| | | | | 118/715 |
| 8,808,798 | B2 * | 8/2014 | Kitano | G03F 7/162 |
| | | | | 438/782 |
| 8,940,365 | B2 * | 1/2015 | Miyata | H01L 21/6715 |
| | | | | 700/121 |
| 9,165,797 | B2 * | 10/2015 | Yoshihara | H01L 21/67 |
| 9,255,331 | B2 * | 2/2016 | Tanaka | C23C 18/1632 |
| 9,623,434 | B2 * | 4/2017 | Amano | G03F 7/3021 |
| 9,679,787 | B2 * | 6/2017 | Furuya | H01L 21/67051 |
| 9,713,822 | B2 * | 7/2017 | Miyagi | B05C 11/10 |
| 10,379,441 | B2 * | 8/2019 | Shimmura | G03F 7/162 |
| 10,755,950 | B2 * | 8/2020 | Nakai | B08B 3/10 |
| 11,065,639 | B2 * | 7/2021 | Inaba | B05D 3/12 |
| 11,208,725 | B2 * | 12/2021 | Mizunaga | H01L 21/6838 |
| 11,273,464 | B2 * | 3/2022 | Shimmura | B05B 14/30 |
| 11,513,083 | B2 * | 11/2022 | Liao | H01L 21/6715 |
| 2006/0068093 | A1 * | 3/2006 | Shite | G03F 7/162 |
| | | | | 118/52 |
| 2012/0034792 | A1 * | 2/2012 | Yoshihara | H01L 21/6715 |
| | | | | 257/E21.24 |
| 2012/0135358 | A1 * | 5/2012 | Tanaka | G03F 7/162 |
| | | | | 430/434 |
| 2018/0012778 | A1 * | 1/2018 | Nakai | H01L 21/67051 |
| 2022/0074053 | A1 * | 3/2022 | Inaba | C23C 18/1692 |
| 2022/0163891 | A1 * | 5/2022 | Eum | H01L 21/6715 |
| 2022/0163892 | A1 * | 5/2022 | Eum | H01L 21/67017 |
| 2022/0163900 | A1 * | 5/2022 | Eum | H01L 21/67178 |
| 2022/0205090 | A1 * | 6/2022 | Kim | C23C 16/4412 |

FOREIGN PATENT DOCUMENTS

| | | |
|---|---|---|
| KR | 10-0629917 | 9/2006 |
| KR | 10-0735746 | 6/2007 |
| KR | 10-1689619 | 12/2016 |

* cited by examiner

APPARATUS FOR PROCESSING SUBSTRATE

CROSS-REFERENCE TO RELATED APPLICATION

This application claims priority under 35 U.S.C. § 119 to Korean Patent Application No. 10-2021-0011699, filed on Jan. 27, 2021, in the Korean Intellectual Property Office, the disclosure of which is incorporated by reference herein in its entirety.

TECHNICAL FIELD

The inventive concept relates to an apparatus for processing a substrate, and more particularly, to an apparatus for processing a substrate including a processing container assembly.

DISCUSSION OF THE RELATED ART

Spin coating is a process that is used to deposit thin films of material, such as insulating layers or photoresist layers, onto a flat substrate, such as a wafer. A coating apparatus such as a spin coater may be used in the spin coating process.

In general, the coating apparatus includes a chuck, on which a substrate is mounted, a supplier for supplying a processing liquid to the substrate, and a process container in which a waste liquid such as a processing liquid is collected. Often, the processing liquid contains a volatile solvent mixed with the deposit material, or is volatile itself. For example, when the photoresist layer is formed on the substrate by using the coating apparatus, fumes may be generated in a gaseous state. These fumes are then discharged through an exhaust pipe connected to the process container. However, excess liquid or contaminants may enter the exhaust pipe, and when the contaminants are accumulated in the exhaust pipe, the exhaust pressure may abnormally change, causing reduced reliability of the coating apparatus and degradation of the coating process.

SUMMARY

The inventive concepts put forth in the present disclosure provide an apparatus for processing a substrate.

According to an aspect of the inventive concept, an apparatus for processing a substrate includes a mount, a processing liquid supply nozzle configured to provide a processing liquid to the substrate, a discharge container including a base plate including a liquid outlet and an exhaust port, an inner wall disposed on an inner circumference of the base plate and extending vertically, an outer wall disposed on an outer circumference of the base plate and extending vertically, and a barrier disposed on the base plate, wherein the barrier separates a first space connected to the liquid outlet from a second space connected to the exhaust port, an inner cover configured to guide a processing liquid from the substrate to the first space of the discharge container, wherein the inner cover includes a first guide plate that covers the second space of the discharge container, and further includes a second guide plate provided between the outer wall and the barrier of the discharge container, a flow guide mounted in the first space of the discharge container, a liquid collecting pipe connected to the liquid outlet of the discharge container, and an exhaust pipe connected to the exhaust port of the discharge container.

According to another aspect of the inventive concept, an apparatus for processing a substrate includes a mount and including a rotation shaft and a spin chuck disposed on the rotation shaft, a processing liquid supply nozzle configured to provide a processing liquid to the substrate supported by the mount, a discharge container on a lower portion of the spin chuck and including a base plate including a liquid outlet and an exhaust port, an inner wall arranged on the base plate to surround the rotation shaft, a barrier arranged on the base plate to surround the inner wall, an outer wall arranged on the base plate to surround the barrier, a first space located between the outer wall and the barrier and connected to the liquid outlet, and a second space located between the inner wall and the barrier and connected to the exhaust port, an inner cover including a first guide plate covering the second space of the discharge container and a second guide plate extending to an inside of the first space of the discharge container from an edge of the first guide plate, an outer cover extending upwards from an upper portion of the outer wall of the discharge container and at least partially surrounding the spin chuck, a flow guide arranged in the first space and including a guide main body at least partially surrounding the outer wall of the discharge container, a plurality of protrusions protruding from a lower portion of the guide main body, and a hook structure hooked to an upper portion of the barrier, a liquid collecting pipe coupled to the liquid outlet of the discharge container, an exhaust pipe coupled to the exhaust port of the discharge container, and a cleaning nozzle configured to spray a cleaning liquid to an inside of the discharge container.

According to another aspect of the inventive concept, an apparatus for processing a substrate includes a mount configured to support the substrate, a processing liquid supply nozzle configured to provide a processing liquid to the substrate supported by the mount, a discharge container including a base plate including a liquid outlet and an exhaust port, and a barrier disposed on the base plate and extending in a vertical direction to separate a first space connected to the liquid outlet from a second space connected to the exhaust port, an inner cover configured to guide the processing liquid from the substrate supported by the mount to the first space of the discharge container, and a flow guide mounted in the first space of the discharge container, wherein the flow guide includes a guide main body having a ring shape, a plurality of protrusions protruding from the guide main body and configured to guide a fluid into the first space, and a flow groove provided between adjacent protrusions of the plurality of protrusions and configured to allow fluid to pass therethrough.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
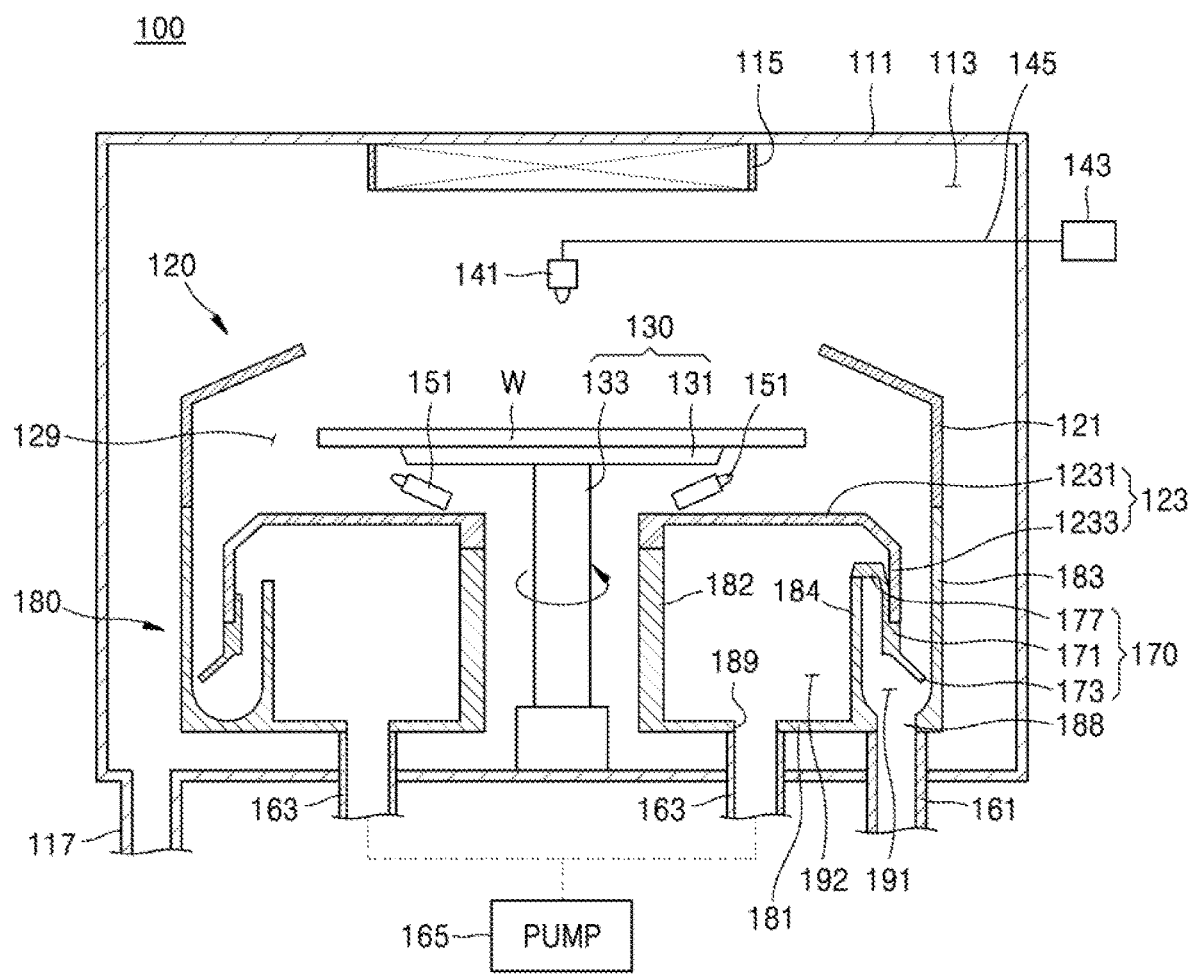
FIG. 1 is a cross-sectional view of an apparatus for processing a substrate according to example embodiments.

Hereinafter, one or more embodiments of the inventive concept will be described in detail with reference to the attached drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

Figure 2:
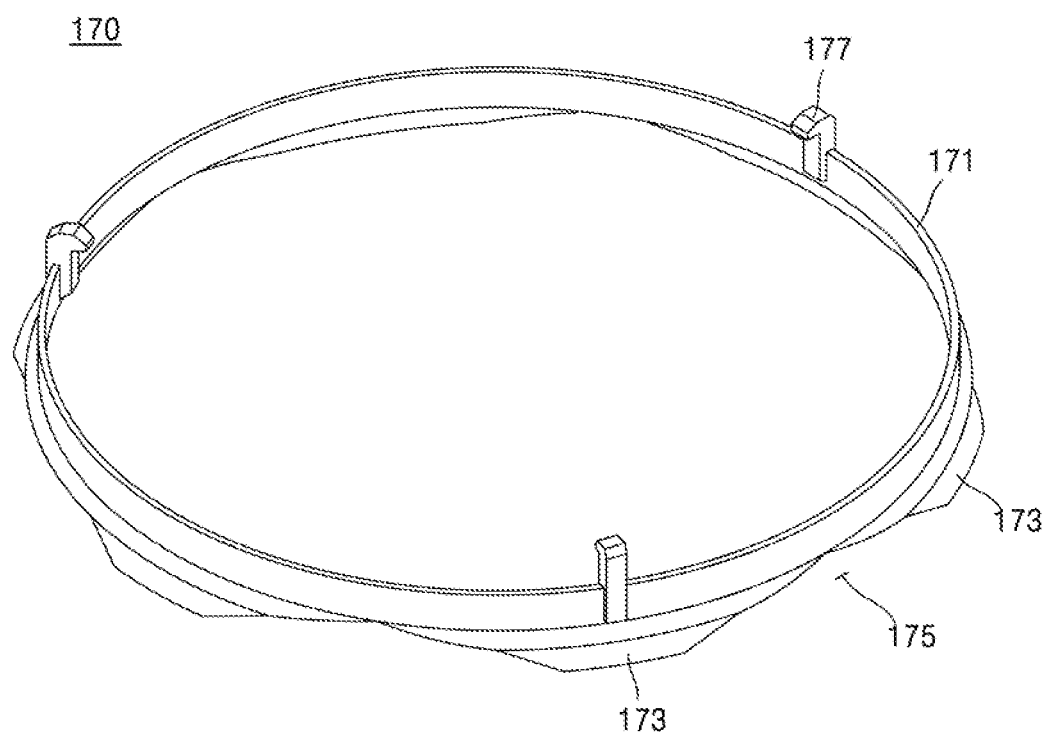
FIG. 2 is a perspective view of a flow guide included in the apparatus of FIG. 1.
Figure 3:
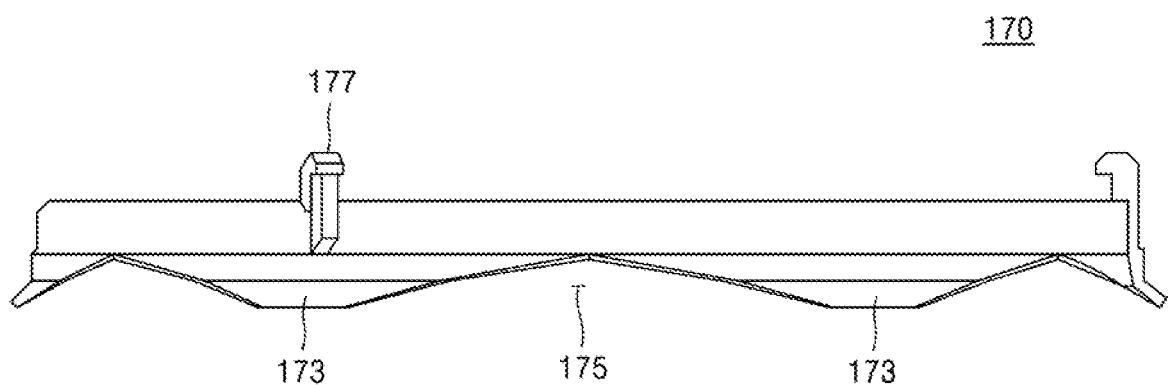
FIG. 3 is a side cut-away view of a flow guide included in the apparatus of FIG. 1.

FIG. 1 is a cross-sectional view of an apparatus 100 for processing a substrate according to example embodiments. FIG. 2 is a perspective view of a flow guide 170 included in the apparatus 100 of FIG. 1. FIG. 3 is a side cut-away view of the flow guide 170 included in the apparatus 100 of FIG. 1.

Referring to FIGS. 1 to 3, the apparatus 100 may provide a processing liquid to a substrate W to process the substrate W. For example, the apparatus 100 may form a material layer on the substrate W from the processing liquid.

As used herein, the term "substrate W" may indicate the substrate W itself or a stack structure including on or more layers, films, or the like formed on a surface of the substrate W. Also, the expression "the surface of the substrate W" may indicate an exposed surface of the substrate W itself or an exposed surface of a layer which is formed on the substrate W. For example, the substrate W may be a wafer or may include a wafer and at least one material layer formed on the wafer. The material layer may include an insulating layer, a polymer layer, and/or a photoresist layer, and the like formed on the wafer.

In example embodiments, the apparatus 100 for processing a substrate may form, on the substrate W, a photosensitive material layer such as a photoresist layer. For example, the apparatus 100 for processing a substrate may form a photosensitive material layer such as a photoresist layer on the substrate W by performing the spin coating process.

The apparatus 100 may include a chamber 111, a substrate support 130, a process container assembly 120, a processing liquid supply nozzle 141, and a cleaning nozzle 151.

The chamber 111 includes an internal space 113 where the substrate W may be processed. In example embodiments, vacuum pressure or atmospheric pressure may be generated in the internal space 113 of the chamber 111. The chamber 111 may include an opening. Through the opening of the chamber 111, the substrate W may be disposed in or discharged from the internal space 113 of the chamber 111. The opening of the chamber 111 may be sealed as needed to separate the internal space 113 of the chamber 111 from an external environment.

On an upper wall of the chamber 111, a fan unit 115 may be installed. For example, the fan unit 115 may include a blower fan. The fan unit 115 may provide a clean gas which flows from the top to bottom of the chamber 111. An exhaust portion 117 may be arranged on the bottom of the chamber 111 to exhaust the gas from the chamber 111. The exhaust portion 117 may be connected to an exhaust device such as a vacuum pipe and may be configured to exhaust the gas from the chamber 111. A descending air current may be formed in the chamber 111 by the fan unit 115 and the exhaust portion 117.

The process container assembly 120 may be arranged in the internal space 113 of the chamber 111. The process container assembly 120 may have an opening formed in an upper portion thereof. The process container assembly 120 may have a process space 129 in which the substrate support 130 and the substrate W mounted on the substrate support 130 may be accommodated.

The substrate support 130 may be arranged in the process space 129 of the process container assembly 120. The substrate support 130 may include a spin chuck 131 and a rotation shaft 133. The spin chuck 131 and the rotation shaft 133 may constitute a mount that is responsible for supporting and rotating the substrate W.

The spin chuck 131 may include a mounting surface on which the substrate W can be mounted. The spin chuck 131 may support the substrate W disposed on the mounting surface of the spin chuck 131. In example embodiments, the spin chuck 131 may support the substrate W through vacuum suction of the substrate W. In example embodiments, the spin chuck 131 may support the substrate W by using an electrostatic force. The rotation shaft 133 may be rotated by an actuator, such as a rotation motor, relative a central axis. The spin chuck 131 may be coupled to the rotation shaft 133 and rotated according to the rotation of the rotation shaft 133. The spin chuck 131 may be elevated in a vertical direction, for example, by the rotation shaft 133.

The processing liquid supply nozzle 141 may supply a processing liquid to the substrate W. The processing liquid supply nozzle 141 may be arranged over the mounting surface of the substrate support 130. The processing liquid supply nozzle 141 may be coupled to a nozzle arm 145 and a processing liquid source 143, and may include a flow path in the nozzle arm 145. The processing liquid supply nozzle 141 may receive the processing liquid supplied from the processing liquid source 143 through the flow path of the nozzle arm 145. The processing liquid supply nozzle 141 may be moved by the nozzle arm 145. For example, the processing liquid supply nozzle 141 may be moved between a spray position, where the processing liquid is sprayed onto the substrate W, and a waiting position, where the processing liquid supply nozzle 141 is spaced apart from the spray position.

In example embodiments, the processing liquid supply nozzle 141 may supply a photosensitive material such as photoresist to the substrate W. For example, while the spin chuck 131 is rotated and the substrate W is supported thereon, the processing liquid supply nozzle 141 may supply liquid photoresist to the center of the substrate W. Because the spin chuck 131 is rotated, the photoresist supplied to the substrate W may be moved in an outward radial direction of the substrate W because of a centrifugal force, and the photoresist may be evenly spread on the entire surface of the substrate W accordingly.

In some example embodiments, the apparatus 100 may further include nozzles for supplying other materials than the processing liquid which is supplied through the processing liquid supply nozzle 141. For example, the apparatus 100 may further include a nozzle for supplying a solvent used during an Edge Bead Removal (EBR) process. When the photoresist layer is formed on the substrate W according to a spin coating method, the thickness of the photoresist layer at an edge portion of the substrate W may be relatively large. That is, a thickness of the photoresist layer coated on a center portion of the substrate W may lesser than the thickness of the photoresist layer coated on the edge portion of the substrate W. In this case, the nozzle may supply a solvent to the edge portion of the substrate W, and thus, the photoresist layer on the edge portion of the substrate W may be partially removed.

The cleaning nozzle 151 may supply a cleaning liquid to the process space 129 of the process container assembly 120. The cleaning nozzle 151 may spray a cleaning liquid to the inside of the process container assembly 120 to remove contaminants that remain in the process container assembly 120. For example, the cleaning nozzle 151 may receive the cleaning liquid for removing the contaminants in the process container assembly 120 from a cleaning liquid source, and may spray the cleaning liquid to the inside of the process container assembly 120. Examples of the cleaning liquid may include a thinner, a solvent such as acetone, and the like.

The cleaning nozzle 151 may be arranged in the process container assembly 120. For example, the cleaning nozzle 151 may be arranged under the spin chuck 131 and may spray the cleaning liquid to a rear surface of the substrate W and/or to the inside of the process container assembly 120. Although FIG. 1 illustrates that the process container assembly 120 may include two cleaning nozzles 151 therein, the present disclosure is not necessarily limited thereto and the process container assembly 120 may include one cleaning nozzle 151 or three or more cleaning nozzles 151.

The process container assembly 120 may collect and discharge a waste liquid. For example, while the substrate W is processed according to the supply of the processing liquid to the substrate W, the processing liquid may flow from the substrate W and fall into the process container assembly 120. Such a waste liquid may be collected in the process container assembly 120, and the collected waste liquid may be discharged to the outside of the process container assembly 120.

The process container assembly 120 may include a discharge container 180, an outer cover 121, an inner cover 123, and the flow guide 170.

With reference to FIG. 1, the discharge container 180 may be arranged under the spin chuck 131 and may include a hollow portion in which the rotation shaft 133 may be accommodated. The discharge container 180 may include a liquid accommodating space where the waste liquid may be collected. The discharge container 180 may include a liquid outlet 188 connected to the liquid accommodating space and configured to discharge the waste liquid. The liquid outlet 188 may be connected to a liquid collecting pipe 161, and the waste liquid collected in the discharge container 180 may be discharged to the liquid collecting pipe 161 through the liquid outlet 188. The discharge container 180 may additionally include a discharge space separated or distinguished from the liquid accommodating space, and may include an exhaust port 189 which is connected to the discharge space and configured to vent the gas. The exhaust port 189 may be connected to an exhaust pipe 163, and the exhaust pipe 163 may be connected to an exhaust pump 165. The exhaust pump 165 may inhale a gas from the discharge container 180 through the exhaust pipe 163 and may discharge the gas from the discharge container 180 through the exhaust pipe 163. For example, a gas, which flows into the discharge container 180, along with a liquid such as the processing liquid, may be discharged to the outside through the exhaust pipe 163. In example embodiments, a plurality of exhaust pipes 163, for example, two or three exhaust pipes 163, may be connected to the discharge container 180.

The discharge container 180 may include a base plate 181, an inner wall 182, an outer wall 183, and a barrier 184.

The base plate 181 may include the liquid outlet 188 and the exhaust port 189. The inner wall 182, the outer wall 183, and the barrier 184 may be disposed on the base plate 181, and extend in a vertical direction. The inner wall 182 may be adjacent to an inner circumference of the base plate 181 and may extend upwards from the base plate 181. The outer wall 183 may be adjacent to an outer circumference of the base plate 181 and may extend upwards from the base plate 181. The barrier 184 may be arranged between the outer wall 183 and the inner wall 182, and may extend upwards from the base plate 181. The barrier 184 may be arranged between the outer wall 183 and the inner wall 182 and may separate or distinguish a first space 191, which is between the barrier 184 and the outer wall 183, from a second space 192, which is between the barrier 184 and the inner wall 182.

The inner wall 182, the outer wall 183, and the barrier 184 may each have a ring shape in a plan view. In a plan view, the inner wall 182 may extend on the base plate 181 to horizontally surround the rotation shaft 133 of the substrate support 130, the barrier 184 may extend on the base plate 181 to horizontally surround the inner wall 182, and the outer wall 183 may extend on the base plate 181 to horizontally surround the barrier 184.

The first space 191 of the discharge container 180 may be defined by the barrier 184, the outer wall 183, and the base plate 181. The first space 191 of the discharge container 180 may be the liquid accommodating space where the waste liquid is collected, and may be connected to the liquid outlet 188 included in the base plate 181. The second space 192 of the discharge container 180 may be defined by the barrier 184, the inner wall 182, and the base plate 181. The second space 192 of the discharge container 180 may be connected to the exhaust port 189 which is included in the base plate 181. A descending air current may be formed in the second space 192 of the discharge container 180 by the exhaust pressure generated from the exhaust pump 165. The gas flowing into the first space 191 of the discharge container 180 may be moved to the second space 192 over the barrier 184, and then may be discharged to the exhaust pipe 163 through the exhaust port 189. Because the second space 192 of the discharge container 180 is separated from the first space 191 of the discharge container 180 where the waste liquid is collected, the gas and liquid may be separated from each other in the discharge container 180 and discharged.

An inner cover 123 may be arranged under the spin chuck 131 and the substrate W supporting the spin chuck 131. The inner cover 123 may be coupled to the discharge container 180. The inner cover 123 may guide the processing liquid flowing from the substrate W towards the first space 191 of the discharge container 180.

In example embodiments, the inner cover 123 may include a first guide plate 1231 which covers the second space 192 of the discharge container 180, and a second guide plate 1233 which extends downwards towards the inside of the first space 191 of the discharge container 180 from an edge of the first guide plate 1231.

The first guide plate 1231 may be connected to an upper portion of the inner wall 182 of the discharge container 180. The first guide plate 1231 may extend outwards in a radial direction from the upper portion of the inner wall 182 of the discharge container 180, and may cover the second space 192 of the discharge container 180. The first guide plate 1231 may be spaced apart vertically from the barrier 184 of the discharge container 180.

The second guide plate 1233 may extend downwards to a height lower than where the upper portion of the barrier 184 is disposed, and may be spaced apart from the base plate 181 in the vertical direction. The second guide plate 1233 may also have a ring shape in a plan view. The second guide plate 1233 may extend substantially in parallel with the barrier 184 in the first space 191 of the discharge container 180. The second guide plate 1233 may horizontally surround the barrier 184, and the outer wall 183 of the discharge container 180 may horizontally surround the second guide plate 1233. The second guide plate 1233 may be arranged between the barrier 184 and the outer wall 183 of the discharge container 180, and may separate a flow path between the second guide plate 1233 and the barrier 184 from a flow path between the second guide plate 1233 and the outer wall 183. The second guide plate 1233 may extend downwards to the inside of the first space 191 of the discharge container 180 from the edge of the first guide plate 1231 and may form a curved flow path in the first space 191 of the discharge container 180.

The processing liquid flowing from the substrate W may flow along the first guide plate 1231 and flow into the first space 191 of the discharge container 180 through the flow path formed between the second guide plate 1233 and the outer wall 183 of the discharge container 180.

The outer cover 121 may be connected to an upper portion of the outer wall 183 of the discharge container 180. A portion of outer cover 121 may have a cylindrical shape which surrounds the substrate W. The outer cover 121 may extend from the upper portion of the outer wall 183 of the discharge container 180 to a height greater than the height at which the substrate W is supported by the substrate support 130.

In example embodiments, the outer cover 121 may include a vertical extending portion which extends from the upper portion of the outer wall 183 of the discharge container 180 in a vertical direction, and an inclined extending portion upwardly inclined and extending inwards from an upper portion of the vertical extending portion. For example, as seen in a cross sectional view of the outer cover 121, the inclined extending portion of the outer cover 121 may form an angle towards a center region where the substrate W is disposed with respect to the vertical extending portion of the outer cover 121. During operation of the apparatus 100, the outer cover 121 may guide the processing liquid dispersed from the substrate W in the radial direction to the discharge container 180. For example, after the processing liquid dispersed from the substrate W in the radial direction collides with the outer cover 121, the processing liquid may flow into the first space 191 of the discharge container 180 along an inner surface of the outer cover 121. The processing liquid moved to the discharge container 180 may be discharged to the liquid collecting pipe 161 through the liquid exhaust port 188 formed on the base plate 181.

The flow guide 170 may be arranged between the barrier 184 and the outer wall 183 of the discharge container 180. The flow guide 170 may be arranged in the first space 191 of the discharge container 180, and may guide a flow of a fluid entering the discharge container 180. The flow guide 170 may be obliquely arranged in the first space 191; this will be further described below. A portion of the flow guide 170 may partially block a flow path defined by the second guide plate 1233 of the inner cover 123 and the outer wall 183 of the discharge container 180. For example, a portion of the flow guide 170 may be obliquely tilted towards the flow path below the downstream of the flow path defined by the second guide plate 1233 of the inner cover 123 and the outer wall 183 of the discharge container 180.

The flow guide 170 may include a guide main body 171 which has a ring shape and protrusions 173 protruding from the bottom of the guide main body 171.

The guide main body 171 may surround the barrier 184. The guide main body 171 may have a cylindrical shape with a hollow center.

The protrusions 173 may be spaced apart from each other along a circumferential direction of the guide main body 171. The protrusions 173 may extend in an outward normal direction from the guide main body 171. The direction in which the protrusions 173 extend is different than the direction in which the guide main body 171 extends, and the direction in which the second guide plate 1233 of the inner cover 123 extends. For example, the protrusions 173 may protrude towards the outer wall 183 of the discharge container 180 from the bottom of the guide main body 171. The protrusions 173 may be downwardly inclined and extend outwards from the bottom of the guide main body 171.

Each protrusion 173 may have a tapered shape with a width that decreases along the outward extension of the protrusion 173 from the bottom of the guide main body 171. For example, the width of a protrusion 173 may be defined as a length of a protrusion 173 in the circumferential direction, and may decrease from the base of the bottom of the guide main body 171 towards an outward direction.

Flow grooves 175 may be formed between neighboring protrusions 173 in the circumferential direction of the guide main body 171. The width of a flow groove 175 may be defined as the empty space between the protrusions 173 along the circumferential direction, and the width of the flow groove 175 may increase towards ends of the protrusions 173. For example, the width of the flow groove 175 in the circumferential direction may increase with distance away from the bottom of the guide main body 171.

In example embodiments, the flow guide 170 may include a plastic material. For example, the flow guide 170 may include polypropylene, Teflon, or the like.

In example embodiments, the flow guide 170 may be formed by a plastic injection molding method. For example, the flow guide 170 may be formed according to an integral plastic injection molding method, and may entirely include the same material. For example, the guide main body 171, the protrusions 173, and a hook structure 177 forming the flow guide 170 may include the same materials.

Figure 4:
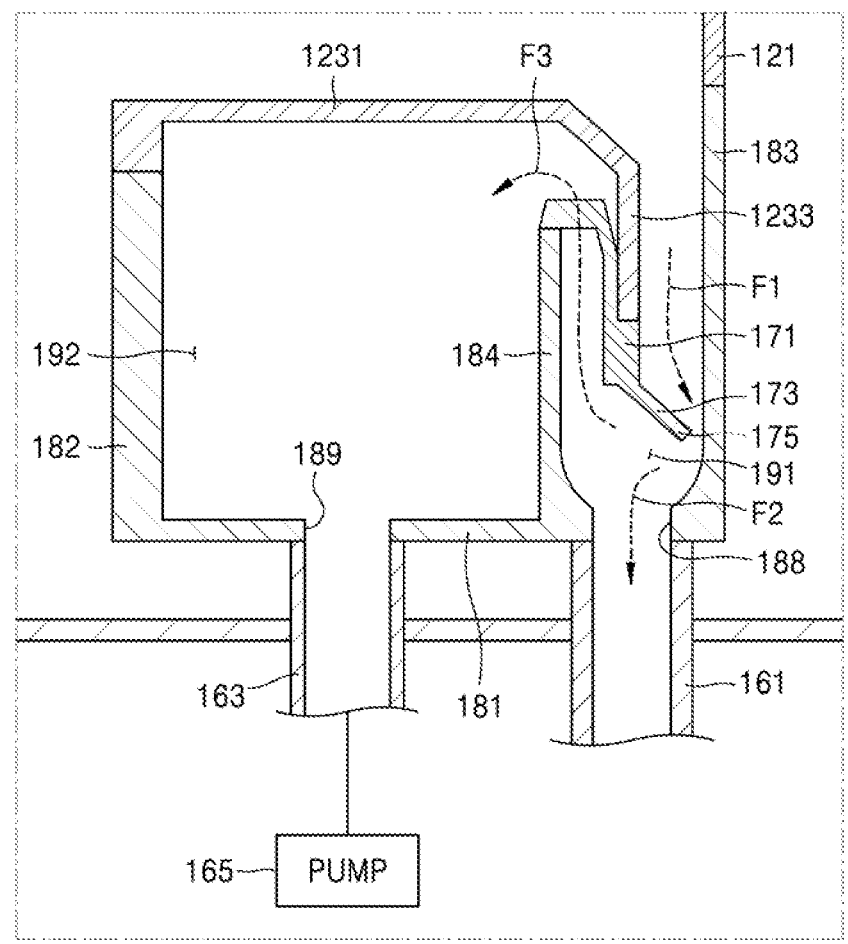
FIG. 4 is a schematic cross-sectional view of a process container assembly of FIG. 1, used for explaining flows of a liquid and a gas moving in the process container assembly.

FIG. 4 is a schematic cross-sectional view of the process container assembly of FIG. 1, used for explaining flows of a liquid and a gas moving in the process container assembly.

Referring to FIGS. 1 to 4, a gas may flow in the first space 191 of the discharge container 180 along with liquids such as the processing liquid and the cleaning liquid. A fluid which includes the liquids and the gas may flow in the first space 191 of the discharge container 180. The liquids may be accommodated in the first space 191, and the gas may flow from the first space 191 over the barrier 184 to the second space 192 which is further inside than the first space 191.

For example, the liquids and the gas flowing into the discharge container 180 may be guided and flow to a surface of the flow guide 170 (e.g., an outer side surface of the guide main body 171 and/or an outer side surface of the protrusion 173) in a first flow direction F1 shown in FIG. 4 and may flow inside the flow guide 170 through the flow groove 175 of the flow guide 170. The liquid passing through the flow groove 175 of the flow guide 170 may be temporarily accommodated (e.g., held) in the first space 191 of the discharge container 180 and discharged to the outside through the liquid collecting pipe 161 in a second flow direction F2 shown in FIG. 4. In addition, because the exhaust pressure (for example, a negative pressure) provided by the exhaust pump 165 is present in the second space 192, the gas may flow to the second space 192 over the barrier 184 in a third flow direction F3 shown in FIG. 4 and may be discharged to the outside through the second space 192 and the exhaust pipe 163.

In some conventional apparatuses, a waste liquid may be sucked into an exhaust pipe along an air current flowing to an exhaust port. When the waste liquid flows in the exhaust pipe, the exhaust pipe is contaminated, and the contamination of the exhaust pipe may cause an abnormal change in the exhaust pressure working in the exhaust pipe.

However, in the present embodiment, in the discharge container 180, the first space 191 where the waste liquid is collected is separated from the second space 192 connected to the exhaust pipe 163 through which the gas is discharged. In the first space 191 of the discharge container 180, the flow guide 170 which guides the flow of the liquid and gas flowing into the discharge container 180 is arranged. Because the flow guide 170 is arranged in the first space 191 of the discharge container 180, a current of the gas flowing into the discharge container 180 is decelerated. Accordingly, the waste liquid may be prevented from being sucked into the second space 192 along the air current flowing to the second space 192 of the discharge container 180, over the barrier 184. Therefore, the contamination of the exhaust pipe 163 by the inflow of the waste liquid to the exhaust pipe 163 may be prevented, and a change in the exhaust pressure according to the contamination of the exhaust pipe 163 may be prevented. As a result, the reliability of a coating process using the apparatus 100 may be increased.

Also, in the present embodiment, because the flow guide 170 is arranged in the first space 191 of the discharge container 180, the contaminants in the exhaust pipe 163 may be prevented from flowing backwards towards the inside of the process container assembly 120 and the substrate W supported by the substrate support 130. Therefore, cleaning of equipment including the process container assembly 120 may be needed less often, and an equipment operation rate may be increased.

Figure 5:
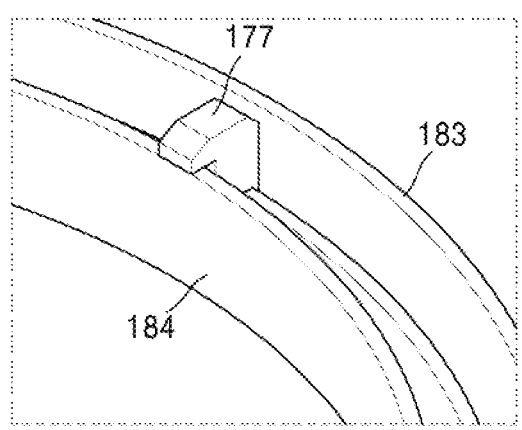
FIG. 5 is a perspective view that illustrates a state in which a flow guide is mounted on a discharge container, according to example embodiments.

FIG. 5 is a perspective view of a state in which the flow guide 170 is mounted on the discharge container 180, according to example embodiments.

Referring to FIGS. 1 to 3 and 5, the flow guide 170 may be suspended in the discharge container 180.

In example embodiments, the flow guide 170 may include hook structures 177 on the upper portion of the guide main body 171. The hook structures 177 are spaced apart from each other in the circumferential direction of the guide main body 171. The number of hook structures 177 may be three as shown in FIG. 2, but the present disclosure is not necessarily limited thereto, and there may be two hook structures, or four or more.

The hook structures 177 of the flow guide 170 may be hooked to the upper portion of the barrier 184. As the hook structures 177 are hooked to the upper portion of the barrier 184, the flow guide 170 may be suspended in the discharge container 180 and fixed thereto. Because the flow guide 170 and the discharge container 180 may be assembled by hooking the hook structures 177 to the barrier 184 of the discharge container 180, the process container assembly 120 may be easily assembled.

Figure 6:
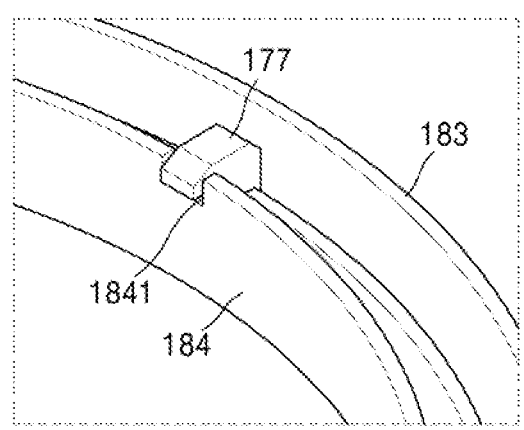
FIG. 6 is a perspective view that illustrates a state in which a flow guide is mounted on a discharge container, according to example embodiments.

FIG. 6 is a perspective view that illustrates a state in which the flow guide 170 is mounted on the discharge container 180, according to example embodiments.

Referring to FIGS. 1 to 3 and 6, the barrier 184 of the discharge container 180 may include locking grooves 1841 in which the hook structures 177 of the flow guide 170 may be inserted. The number of the locking grooves 1841 in the barrier 184 may match the number of the hook structures 177. The locking grooves 1841 may be located along the circumference of the barrier 184 to correspond to the hook structures 177. Because the hook structures 177 of the flow guide 170 are inserted into the locking grooves 1841 of the barrier 184, the flow guide 170 may be rigidly fixed to the barrier 184.

Figure 7:
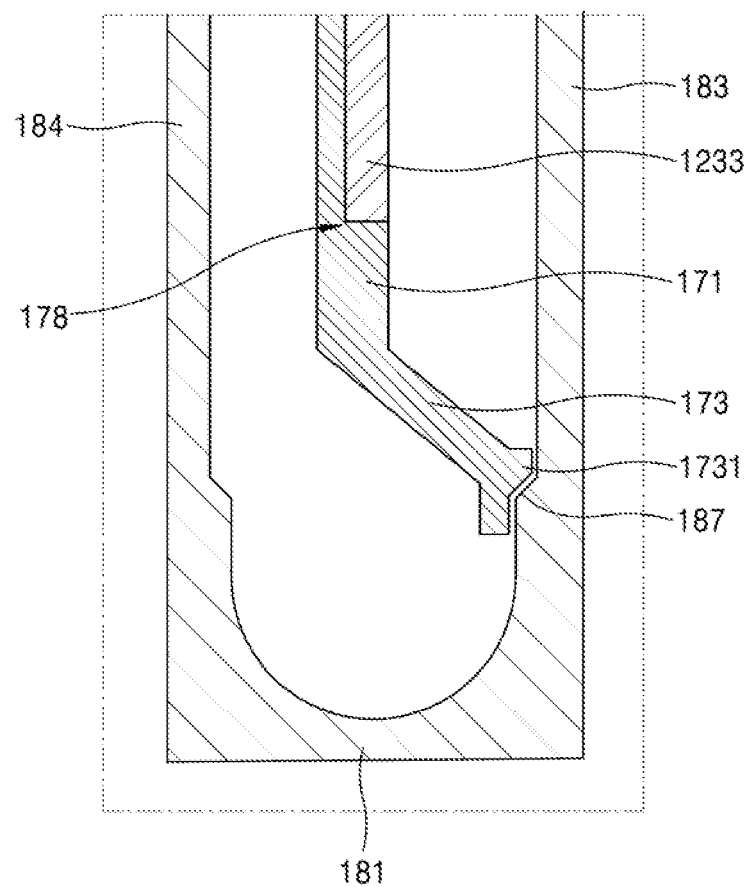
FIG. 7 is a cross-sectional view that illustrates a state in which a flow guide is mounted on a discharge container, according to example embodiments.

FIG. 7 is a cross-sectional view that illustrates a state in which the flow guide 170 is mounted on the discharge container 180, according to example embodiments.

Referring to FIGS. 1 to 3 and 7, the protrusions 173 of the flow guide 170 may be in contact with an inner surface of the discharge container 180. The protrusions 173 of the flow guide 170 may be supported by the inner surface of the discharge container 180. As the protrusions 173 of the flow guide 170 are supported by the inner surface of the discharge container 180, the flow guide 170 may be mounted on the discharge container 180. In example embodiments, engaging portions 187 may be formed on the inner surface of the discharge container 180 and contact the protrusions 173 of the flow guide 170. The engaging portions 187 may be wall extensions that are able to support the protrusions 173. The protrusions 173 of the flow guide 170 may be engaged to the engaging portions 187 of the discharge container 180. The protrusions 173 of the flow guide 170 may include projections 1731 which project outwards so that the protrusions 173 of the flow guide 170 may be engaged to the engaging portions 187 of the discharge container 180.

In some example embodiments, the flow guide 170 may be fixed to the discharge container 180 because the protrusions 173 are supported to the inner surface of the discharge container 180 and the hook structures 177 are hooked to the upper portion of the barrier 184.

In some example embodiments, the flow guide 170 may be fixed to the discharge container 180 by only the support of the protrusions 173 to the inner surface of the discharge container 180, and the hook structures 177 of the flow guide 170 may be omitted.

The flow guide 170 may contact and support the second guide plate 1233 of the inner cover 123. The guide main body 171 of the flow guide 170 may include a steps 178 at locations where the guide main body 171 contacts a lower portion of the second guide plate 1233 of the inner cover 123. The step 178 of the flow guide 170 may be defined by a supporting surface which contacts and supports the lower end of the second guide plate 1233 of the inner cover 123 as well as an outer side surface of the flow guide 170 that extends upwards from the supporting surface. The outer side surface of the flow guide 170, which extends upwards from the supporting surface of the flow guide 170, may contact an inner side surface of the second guide plate 1233.

Figure 8:
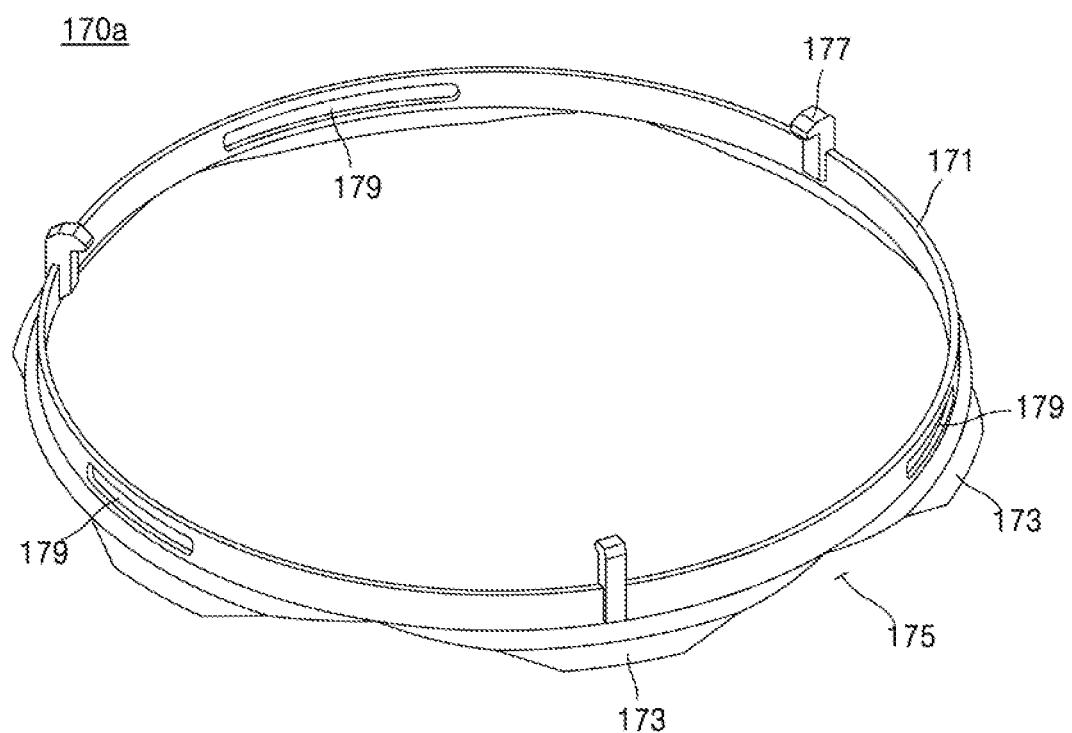
FIG. 8 is a perspective view of a flow guide according to example embodiments.

FIG. 8 is a perspective view of a flow guide 170a according to example embodiments.

The flow guide 170a of FIG. 8 may be similar to or identical to the flow guide 170 of FIGS. 1 to 3 except in that the flow guide 170a further includes through holes 179.

Referring to FIGS. 1 to 3 and 8, the flow guide 170a may include the through holes 179. The through hole 179 may penetrate the guide main body 171 and/or the protrusion 173.

For example, the flow guide 170a may include the through holes 179 arranged spaced apart from each other in a circumferential direction. The through holes 179 may allow a fluid flowing in the discharge container 180 to pass through the flow guide 170a.

Because the through holes 179 are formed in the flow guide 170a, the fluid flowing in the discharge container 180 may pass the flow guide 170a through the flow grooves 175 as well as the through holes 179 between the protrusions 173. The through holes 179 may adjust a rate of velocity reduction of an air current by the flow guide 170a. For example, by appropriately adjusting the size(s) and the number of through holes 179, the rate of velocity reduction of the air current by the flow guide 170a may be adjusted.

While the inventive concept has been particularly shown and described with reference to embodiments thereof, it will be understood that various changes in form and details may be made therein without departing from the spirit and scope of the following claims.

What is claimed is:

1. An apparatus for processing a substrate, the apparatus comprising:
    a mount configured to support a substrate;
    a processing liquid supply nozzle configured to provide a processing liquid to the substrate;
    a discharge container comprising a base plate comprising a liquid outlet and an exhaust port, an inner wall disposed on an inner circumference of the base plate and extending vertically, an outer wall disposed on an outer circumference of the base plate and extending vertically, and a barrier disposed on the base plate, wherein the barrier separates a first space connected to the liquid outlet from a second space connected to the exhaust port;
    an inner cover configured to guide a processing liquid from the substrate to the first space of the discharge container, wherein the inner cover comprises a first guide plate that covers the second space of the discharge container, and further comprises a second guide plate provided between the outer wall and the barrier of the discharge container; and
    a flow guide in the first space of the discharge container, wherein the flow guide is affixed to an upper portion of the barrier via a hook structure.

2. The apparatus of claim 1, wherein the flow guide further comprises:
    a guide main body at least partially surrounding the barrier; and
    a plurality of protrusions protruding from a lower portion of the guide main body, wherein the protrusions in the plurality of protrusions are spaced apart from each other along the circumference of the guide main body, and
    wherein flow grooves are disposed between adjacent protrusions among the plurality of protrusions.

3. The apparatus of claim 2, wherein each of the plurality of protrusions of the flow guide is diagonally inclined with respect to a plane of the substrate and extends outwards from the lower portion of the guide main body.

4. The apparatus of claim 2, wherein the protrusions of the plurality of protrusions contact an inner surface of the discharge container.

5. The apparatus of claim 4, wherein the discharge container further comprises a wall extension provided in the inner surface of the discharge container, and
    wherein each of the plurality of protrusions include a projection configured to engage to the wall extension.

6. The apparatus of claim 1, wherein the barrier of the discharge container comprises one or more locking grooves configured to interlock with the hook structure.

7. The apparatus of claim 2, wherein the second guide plate is disposed in the first space of the discharge container, and extends parallel to the barrier, and
    wherein each of the plurality of protrusions of the flow guide extends in a direction different from a direction in which the second guide plate extends.

8. The apparatus of claim 7, wherein the flow guide comprises a step at a location where the flow guide contacts a lower portion of the second guide plate.

9. The apparatus of claim 2, wherein the flow guide comprises a through hole.

10. The apparatus of claim 1, further comprising: a liquid collecting pipe connected to the liquid outlet of the discharge container; and
    an exhaust pipe connected to the exhaust port of the discharge container, and
    wherein the flow guide comprises a plastic material.

11. The apparatus of claim 1, further comprising an outer cover, wherein the outer cover is disposed on and is coupled to an upper portion of the outer wall of the discharge container, and wherein the outer cover extends from the upper portion of the outer wall of the discharge container to a height greater than a combined height of the substrate supported by the mount.

12. The apparatus of claim 1, wherein the flow guide consists of a singular integral piece that is affixed to the barrier of the discharge container.

13. An apparatus for processing a substrate, the apparatus comprising:
    a rotation shaft;
    a spin chuck disposed on the rotation shaft;
    a processing liquid supply nozzle configured to provide a processing liquid to the substrate;
    a discharge container disposed below the spin chuck and comprising a base plate comprising a liquid outlet and an exhaust port, an inner wall provided on the base plate to surround the rotation shaft, a barrier provided on the base plate to surround the inner wall, an outer wall provided on the base plate to surround the barrier, a first space located between the outer wall and the barrier and connected to the liquid outlet, and a second space located between the inner wall and the barrier and connected to the exhaust port;
    an inner cover comprising a first guide plate covering the second space of the discharge container and a second guide plate extending to an inside of the first space of the discharge container from an edge of the first guide plate;
    an outer cover extending upwards from an upper portion of the outer wall of the discharge container and at least partially surrounding the spin chuck;
    a flow guide in the first space, the flow guide comprising a guide main body at least partially surrounding the outer wall of the discharge container; a plurality of protrusions protruding from a lower portion of the guide main body; and a hook structure;
    a liquid collecting pipe connected to the liquid outlet of the discharge container;
    an exhaust pipe connected to the exhaust port of the discharge container; and
    a cleaning nozzle configured to spray a cleaning liquid to an inside of the discharge container,
    wherein the flow guide is affixed to an upper portion of the barrier via the hook structure.

14. The apparatus of claim 13, wherein each of the plurality of protrusions of the flow guide extends to the outer wall of the discharge container from the lower portion of the guide main body,
wherein a flow groove is between the adjacent protrusions among the plurality of protrusions, and
wherein each of the plurality of protrusions comprises a projection configured to engage with a wall extension provided in an inner surface of the discharge container.

15. The apparatus of claim 14, wherein a length in a circumferential direction of each of the plurality of protrusions decreases with distance away from the lower portion of the guide main body, and
wherein a length of the flow groove in the circumferential direction increases further from the lower portion of the guide main body.

16. The apparatus of claim 13, wherein the processing liquid supply nozzle is configured to provide a liquid photoresist material to the substrate, and
wherein the cleaning nozzle is configured to spray a thinner to an inside of the discharge container.

17. The apparatus of claim 13, wherein the second guide plate extends between the barrier and the outer wall of the discharge container, and
wherein the flow guide comprises a step at a location where the flow guide contacts a lower portion of the second guide plate.

18. The apparatus of claim 13, wherein the guide main body, the plurality of protrusions, and the hook structure of the discharge container each include a same material.

19. An apparatus for processing a substrate, the apparatus comprising:
a mount configured to support a substrate;
a processing liquid supply nozzle configured to provide a processing liquid to the substrate supported by the mount;
a discharge container comprising:
a base plate comprising a liquid outlet and an exhaust port; and
a barrier disposed on the base plate and extending in a vertical direction to separate a first space connected to the liquid outlet from a second space connected to the exhaust port:
an inner cover configured to guide the processing liquid from the substrate supported by the mount to the first space of the discharge container; and
a flow guide in the first space of the discharge container, wherein the flow guide comprises:
a guide main body having a ring shape;
a plurality of protrusions protruding from the guide main body and configured to guide a fluid into the first space;
a flow groove provided between adjacent protrusions of the plurality of protrusions and configured to allow fluid to pass therethrough; and
a hook structure provided on an upper portion of the guide main body,
wherein the flow guide is affixed to an upper portion of the barrier via the hook structure.

20. The apparatus of claim 19, wherein
each of the plurality of protrusions comprises a projection configured to engage with a wall extension provided in an inner surface of the discharge container.

* * * * *